(12) United States Patent
Zarabadi

(10) Patent No.: US 6,198,350 B1
(45) Date of Patent: Mar. 6, 2001

(54) SIGNAL AMPLIFIER WITH FAST RECOVERY TIME RESPONSE, EFFICIENT OUTPUT DRIVER AND DC OFFSET CANCELLATION CAPABILITY

(75) Inventor: Seyed Ramezan Zarabadi, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/290,835

(22) Filed: Apr. 13, 1999

(51) Int. Cl.[7] ............................................. H03F 3/26
(52) U.S. Cl. .................. 330/297; 330/256; 330/298; 330/9; 330/10; 330/310; 327/307
(58) Field of Search ................... 330/256, 297, 330/261, 298, 207 P, 9, 10, 255, 310; 327/307

(56) References Cited

U.S. PATENT DOCUMENTS

| | | | |
|---|---|---|---|
| 3,035,233 | * 5/1962 | Heyser | 330/310 |
| 3,467,908 | * 9/1969 | Burwen | 330/256 |
| 3,526,810 | * 9/1970 | Williams et al. | 330/298 |
| 4,027,270 | * 5/1977 | Pitel | 330/255 |
| 5,008,632 | * 4/1991 | Sutterlin | 330/256 |
| 5,815,040 | * 9/1998 | Barbetta | 330/255 |

* cited by examiner

Primary Examiner—Michael B Shingleton
(74) Attorney, Agent, or Firm—Jimmy L. Funke

(57) ABSTRACT

A signal amplifying circuit (24) includes level shifting input circuits (D1–D4) permitting input common-mode voltages (VIN1 and VIN2) of an amplifier and fault detection circuit (50) to vary between preset limits. The sense amplifier circuit (24) includes a DC offset buffer circuit (52) operable to receive an analog DC offset compensation signal and provide this signal to an input of the amplifier and fault detection circuit (50). The buffered DC offset compensation signal provided to the amplifier and fault detection circuit (50) is operable to reduce an aggregate DC offset voltage attributable to signal amplifying circuit (24) to a desired DC offset level. The amplifier and fault detection circuit (50) also includes a fault detection function whereby an output (VSENSE) of the amplifier circuit (50) is forced to a predetermined output state if either, or both, of the inputs (VIN1 and VIN2) of the sense amplifier circuit (24) are unconnected; i.e., floating. The output (VSENSE) of the amplifier and fault detection circuit (50) is provided to an output buffer circuit (54) operable to modulate the load current supplied to an output (VOUT1, VOUT2) thereof as a function of a difference between the amplifier output signal (VSENSE) and the output buffer output signal (VOUT1).

16 Claims, 4 Drawing Sheets

SIGNAL AMPLIFIER WITH FAST RECOVERY TIME RESPONSE, EFFICIENT OUTPUT DRIVER AND DC OFFSET CANCELLATION CAPABILITY

TECHNICAL FIELD

The present invention relates generally to signal amplifying circuits, and more specifically to such circuits used for sensing and amplifying motor winding current signals such as those produced by brushless DC motors.

BACKGROUND OF THE INVENTION

Systems for controlling speed, torque and/or position of DC motors are known and have been widely used in a variety of applications including automotive control systems. Generally, such DC motors fall into two broad categories; namely brushed DC motors and brushless DC motors. While brushless DC motors typically offer desirable performance features and certain advantages over brushed DC motors in an automotive environment, such features and advantages may often be offset by the complexity of motor control and motor drive circuits required to accurately control motor operation. For example, controlled stoppage, accurate motor shaft positioning, motor reversal and consistent control of motor output torque are all difficult to achieve with brushless DC motors.

Dedicated systems for controlling and driving brushless DC motors are known. In such systems, a motor control circuit is typically operable to detect motor shaft position as well as motor drive current, and a motor drive circuit is, in turn, responsive to motor control signals supplied by the motor control circuitry to drive the DC motor in a desired manner. In known DC motor drive circuits, the motor control circuit typically includes a number of motor position sensors for providing a corresponding number of signals indicative of motor position as well as a sense amplifier operable to amplify one or more signals corresponding to motor drive current. The motor control circuit is typically responsive to motor position and/or motor drive current to provide the motor control signals to the motor drive circuit. Generally, the resolution of the motor control circuit is dependent upon the performance of the sense amplifier as well as the accuracy of the motor position detection circuitry.

Heretofore, many configurations of analog sense amplifiers have been designed, and some such configurations have been widely used in motor control circuits. However, such sense amplifier circuits suffer from several drawbacks, particularly when used in high voltage automotive applications. For example, known sense amplifiers developed for automotive applications often suffer from slow response time and high power dissipation. Moreover, due to high DC gains required in motor control circuit applications, most known sense amplifier circuits exhibit unacceptably high DC offset voltages, thereby resulting in a reduction of available system bandwidth. What is therefore needed is an improved sense amplifier circuit particularly suited for motor control system applications that is both power efficient and capable of high speed operation in a high voltage automotive environment

SUMMARY OF THE INVENTION

The present invention addresses the foregoing shortcomings in known signal amplifying circuits. In accordance with one aspect of the present invention, a signal amplifying circuit comprises an amplifier having first and second inputs and an amplifier output defining an output of the signal amplifying circuit, a first diode circuit having a cathode defining a first input of the signal amplifying circuit and an anode, a first resistor connected between the anode of the first diode circuit and the first input of the amplifier, a first current source supplying a first current to a common connection of the anode of the first diode circuit and the first resistor, a second diode circuit having a cathode defining a second input of the signal amplifying circuit and an anode, a second resistor connected between the anode of the second diode circuit and the second input of the amplifier, and a second current source supplying a second current to a common connection of the anode of the second diode circuit and the second resistor.

In accordance with another aspect of the present invention, a signal amplifying circuit comprises an amplifier defining a first input, a second input and an output, wherein the amplifier is adapted for connection to a first voltage supply producing a first voltage reference. The amplifier is further adapted to receive a differential input signal at the first and second inputs and produce as an amplifier output signal an amplified representation of the differential input signal at the amplifier output between a range of the first voltage reference and a lower reference potential. Also included is an output buffer having an input stage connected to the output of the amplifier and an output stage, wherein the output stage is adapted for connection to a second voltage supply producing a second voltage reference greater than the first voltage reference. The output buffer receives the amplifier output signal at the output buffer input and produces as a buffered output signal the amplified representation of the differential input signal at the output buffer stage between a range of the second voltage reference and the lower reference potential.

In accordance with a further aspect of the present invention, a signal amplifying circuit comprises an amplifier responsive to an input signal to produce as amplifier output signal an amplified representation of the input signal, and an output buffer having an input stage receiving the amplifier output signal and an output stage responsive to the amplifier output signal to produce a buffered output signal and associated load current at a buffer output. The output buffer includes means for comparing the amplifier output signal with the buffered output signal and modulating the load current as a function of a difference between the amplifier output signal and the buffered output signal.

One object of the present invention is to provide an improved signal amplifier circuit.

Another object of the present invention is to provide such an improved signal amplifier circuit capable of high speed operation in a high voltage environment while also minimizing power dissipation.

Yet another object of the present invention is to provide such an improved signal amplifier circuit capable of cancelling DC offset voltages attributable to the amplifier circuit itself.

Still another object of the present invention is to provide an improved signal amplifier circuit capable of allowing below-ground input voltages and of providing for input fault detection capability.

These and other objects of the present invention will become more apparent from the following description of the preferred embodiment.

BRIEF DESCRIPTION OF THE DRAWINGS

The present invention will now be described, by way of example, with reference to the accompanying drawings, in which.

DESCRIPTION OF THE PREFERRED EMBODIMENT

Figure 1:
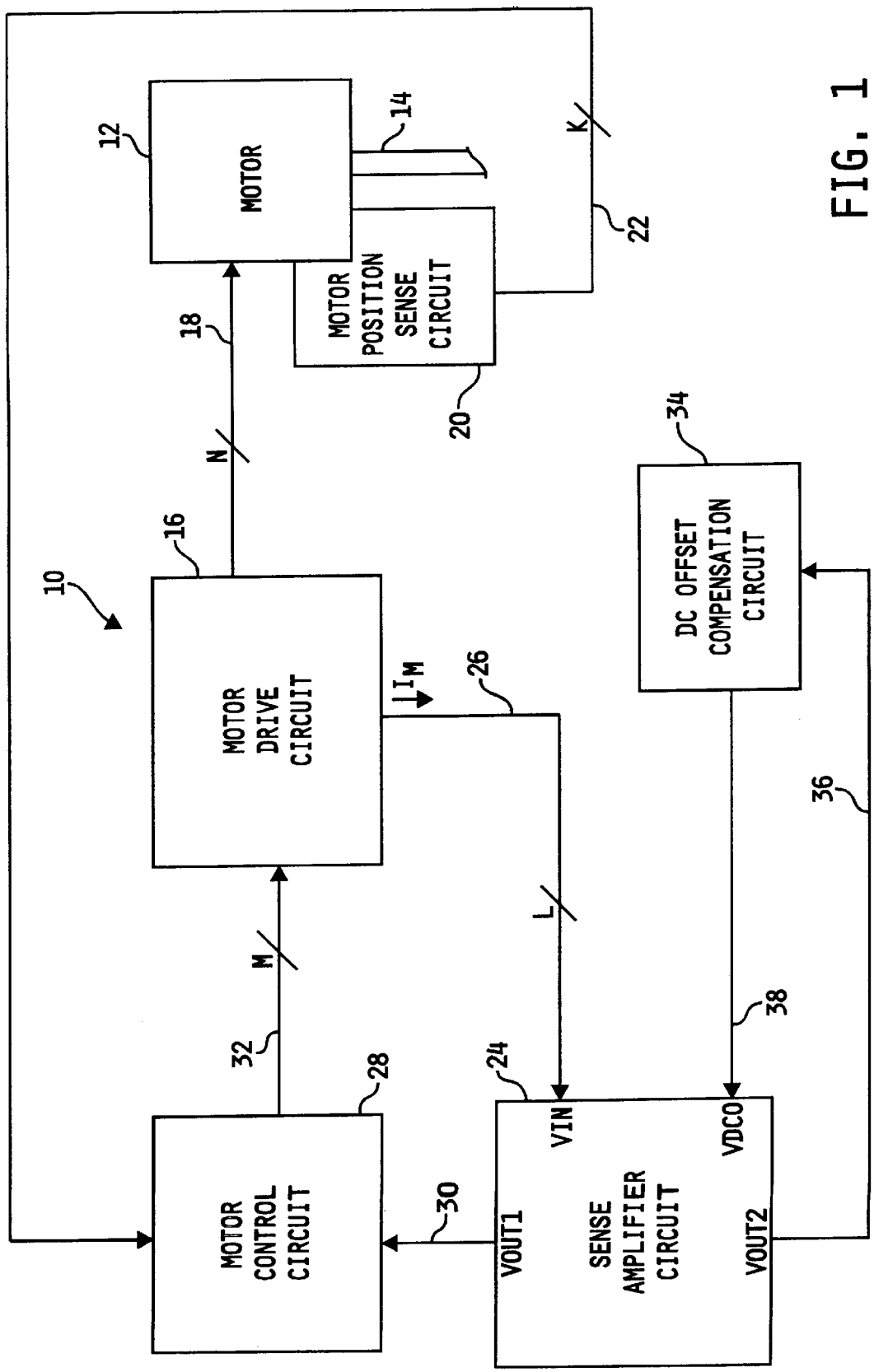
FIG. 1 is a diagrammatic illustration of one embodiment of a motor control system, in accordance with the present invention.

Referring now to FIG. 1, one embodiment of a motor control system 10, in accordance with the present invention, is illustrated. System 10 includes a DC motor 12, which is preferably a known brushless DC motor, operable to drive a rotor or output shaft 14 as is known in the art. Motor 12 is electrically connected to a motor drive circuit 16 via a number, N, of signal paths 18, wherein N may be any integer. Motor drive circuit 16 is operable to provide appropriate motor drive signals on signal paths 18, whereby motor 12 is responsive to such signals to actuate rotor 14 as is known in the art. In one embodiment, the motor drive circuit 16 is partitioned into a predriver circuit and a power drive circuit, and one preferred embodiment of such a motor drive circuit is described in co-pending U.S. application Ser. No. 09/290,594, filed by Seyed R. Zarabadi and having attorney docket number H-205092, which is assigned to the assignee of the present invention and the contents of which are incorporated herein by reference.

A motor position sense circuit 20 is, in one embodiment, associated with motor 12, wherein sense circuit 20 is operable to sense a position (and rotational speed) of rotor 14 relative to a motor armature (not shown) in a known manner. Preferably, motor position sense circuit 20 includes, in this embodiment, a number of Hall effect sensors operable to sense rotor position and produce a corresponding number of rotor position signals as is known in the art. Alternatively, sense circuit 20 may include a number of other known sensors or sensing circuits operable to sense rotor position and produce a corresponding number of rotor position signals, an example of which includes, but is not limited to, a variable reluctance sensor. In either case, motor position sense circuit 20 is operable to provide a number, K, of motor position signals to a motor control circuit 28 of known construction via a number, K, of corresponding signal paths 22, wherein K may be any integer.

Motor drive circuit 16 includes known circuitry therein for detecting motor winding current $I_M$ and providing a number, L, of analog signals indicative thereof to an input VIN of a sense amplifier circuit 24, in accordance with the present invention, via a corresponding number, L, of signal paths 26, wherein L may be any integer. Sense amplifier circuit 24 further includes a first output VOUT1 electrically connected to motor control circuit 28 via a signal path 30, wherein sense amplifier circuit 24 is operable to provide an amplified representation of the number, L, of analog motor current signals to control circuit 28 via signal path 30. The motor control circuit 28 is electrically connected to motor drive circuit 16 via a number, M, of signal paths 32, wherein M may be any integer. Motor control circuit 28 is operable to receive the number, K, of analog motor position signals provided thereto by motor position sense circuit 20 as well as the number, L, of analog motor current signals provided thereto by sense amplifier 24, and provide motor drive circuit 16 with the number, M, of motor control signals, whereby motor drive circuit 16 is responsive to the number, M, of motor control signals to drive motor 12 in accordance therewith, as is known in the art. In one embodiment, motor control circuit 28 is a microprocessor or includes a microprocessor-based control circuit capable of discerning a current motor position from the number, K, of analog motor position signal provided by motor position sense circuit 20, and capable of discerning motor winding current from the number, L, of motor current signals provided by sense amplifier circuit 24. Based at least on the current motor position and motor winding current, motor control circuit 28 is operable to determine a number, M, of motor control signals indicative of desired motor control, as is known in the art.

In accordance with the present invention, sense amplifier circuit 24 further includes a second output VOUT2 electrically connected to an input of a DC offset compensation circuit 34 via signal path 36. DC offset compensation circuit 34 includes an output that is electrically connected to a input VDCO of sense amplifier circuit 24 via signal path 38. The DC offset compensation circuit 34 is operable to minimize an aggregate DC offset voltage attributable to sense amplifier circuit 24 in order to maintain a full dynamic range of motor control system 10, and details of one preferred embodiment of DC offset compensation circuit 34 are described in co-pending U.S. patent application Ser. No. 09/290,929, filed by Seyed R. Zarabadi et al. and having attorney docket number H-205346, which is assigned to the assignee of the present invention and the contents of which are incorporated herein by reference.

Figure 2:
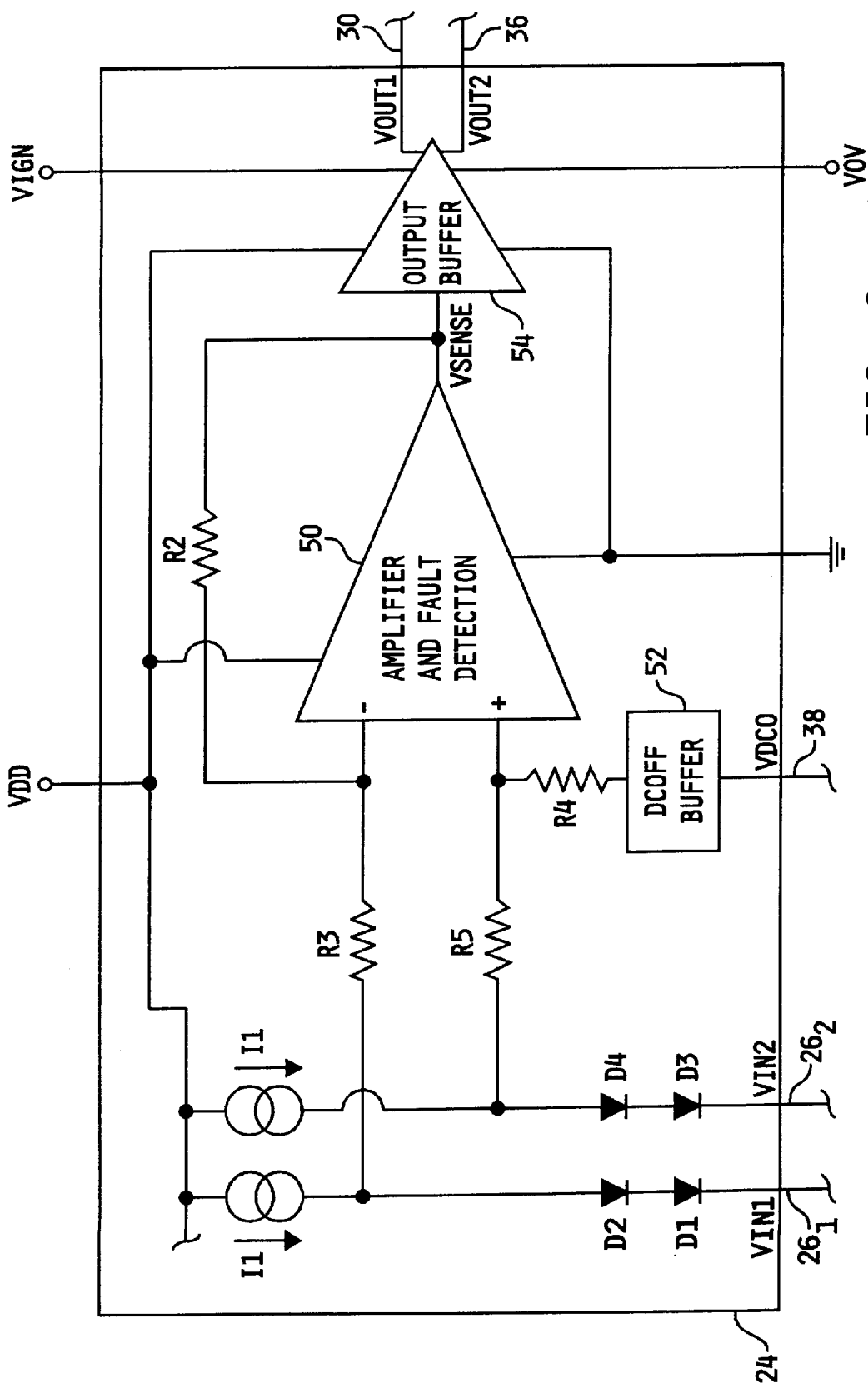
FIG. 2 is a diagrammatic illustration of one preferred embodiment of the sense amplifier portion of the motor control system illustrated in FIG. 1, in accordance with the present invention.

Referring now to FIG. 2, a simplified diagram of one preferred embodiment of the sense amplifier circuit 24, in accordance with the present invention, is shown. Sense amplifier circuit 24 includes first input VIN1 electrically connected to signal path $26_1$ (one of the number, L, of signal paths 26 of FIG. 1) and to a cathode of a first diode D1. The anode of D1 is connected to a cathode of a second diode D2, the anode of which is connected to an output of a first current source I1 referenced to a predetermined potential VDD (e.g., approximately 5.0 volts, although other VDD voltage levels are contemplated) and to one end of a resistor R3. The opposite end of R3 is electrically connected to an inverting input of an amplifier and fault detection circuit 50 which is represented in FIG. 2 as an operational amplifier, and to one end of a resistor R2. The opposite end of R2 is connected to an output VSENSE of amplifier 50 and to an input of an output buffer 54. The output buffer 54 provides two outputs; VOUT1 which is electrically connected to signal path 30 and VOUT2 which is electrically connected to signal path 36.

A second input VIN2 is electrically connected to signal path $26_2$ (another one of the number, L, of signal paths 26 of FIG. 1) and to a cathode of a third diode D3. The anode of D3 is connected to a cathode of a fourth diode D4, the anode of which is electrically connected to the output of a mirror circuit connected to the first current source I1 and to one end of a resistor R5. The opposite end of R5 is electrically connected to the non-inverting input of amplifier 50 and to one end of a resistor R4. The opposite end of R4 is electrically connected to an output of DCOFF buffer circuit 52 which is preferably a unit gain buffer circuit. An input of DCOFF buffer 52 defines the VDCO input of amplifier circuit 24 and is electrically connected to signal path 38.

It is important to note that amplifier and fault detection circuit 50 is powered by a voltage source supplying the potential VDD, while the output buffer circuit 54 is partially powered by the voltage source supplying the potential VDD and partially powered by another voltage source supplying the potential VIGN (e.g., automotive battery voltage, although other VIGN voltages are contemplated). As will be described more fully hereinafter, the sense amplifier circuit 24 takes advantage of such a configuration to provide for power efficient operation. Both of the amplifier and fault detection 50 and output buffer 54 circuits are referenced at ground potential and output buffer 54 includes an input VOV that is preferably connected to an external overvoltage protection circuit of known construction. As will be described in greater detail with respect to FIG. 4, output buffer 54 is operable to monitor the VOV input and if an overvoltage condition is present as indicated by the VOV signal level, output buffer 54 is operable to control outputs VOUT1 and VOUT2 to a predetermined state (e.g., ground reference).

Preferably, current source I1 is designed to have a predetermined temperature dependence. Since the currents flowing through the two diode circuits comprising diodes D1 and D2 and the diodes D3 and D4 respectively are inversely proportional to temperature, as is known in the art, current source I1 is preferably designed to be directly proportional to temperature to thereby compensate for the inverse temperature dependency of the diode currents. The gain of sense amplifier circuit 24 is determined by the resistor ratios R4/R5 and R2/R3, and by designing current source I1 to exhibit a linear temperature dependency, the amplifier gain is accordingly temperature independent. Details of one preferred embodiment of the device level construction of current source I1 for linear temperature dependency will be described more fully hereinafter with respect to FIG. 3. Those skilled in the art will, however, recognize that current source I1 may alternatively be designed to produce a current I1 that exhibits any predefined temperature dependency to thereby define an amplifier gain having any desired net temperature dependency. Many such current source designs are known, and providing for a gain of amplifier circuit 24 having nearly any desired net temperature dependency would accordingly be a mechanical step for a skilled artisan.

Figure 3:
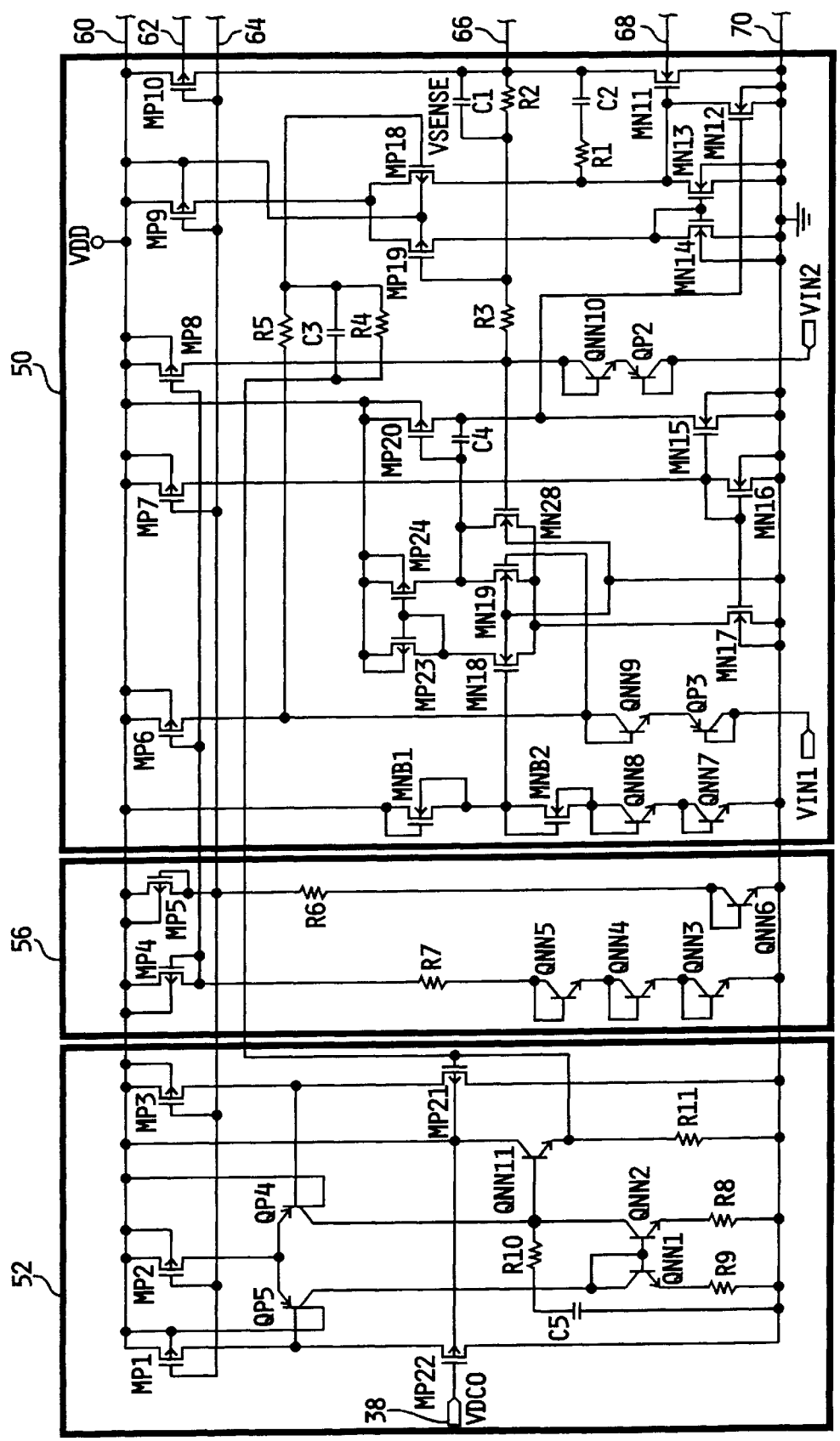
FIG. 3 is a schematic diagram of one preferred embodiment of the amplifier and DC offset buffer circuits illustrated in FIG. 2, in accordance with the present invention.

Referring now to FIG. 3, one preferred embodiment of a device-level structure of the DCOFF buffer 52, the amplifier and fault detection circuit 50 and current generating circuitry 56, in accordance with the present invention, are shown. Starting with the DCOFF buffer 52, signal path 38 (the VDCO input of buffer 52) is connected to the gate of a p-MOS transistor MP22 having a drain connected to ground reference and a source connected to a drain of another p-MOS transistor MP1 and to the base of a PNP transistor QP5. The source of MP1 is connected to VDD and the gate of MP1 is connected to the gates of p-MOS transistors MP2, MP3, MP5, MP7, MP9 and MP10. The sources of MP2, MP3 MP5, MP7, MP9 and MP10 are connected to VDD and the drain of MP2 is connected to the emitters of QP5 and another PNP transistor QP4. The base of QP4 is connected to the drain of MP3 and to the source of a p-MOS transistor MP21, wherein the drain of MP21 is referenced to ground potential. The gate of MP21 is connected to the emitter of a NPN transistor QNN11, and to one end of a capacitor C3 and one end of resistor R4 forming part of the amplifier and fault detection circuit 50. The collector of QNN11 is connected to VDD and the base of QNN11 is connected to the collector of QP4, the collector of a NPN transistor QNN2 and to one end of a resistor R10. The opposite end of R10 is connected to a capacitor C5 referenced to ground potential. The base of QNN2 is connected to the base and collector of a NPN transistor QNN1 and to the collector of QP5. The emitters of QNN1 and QNN2 are connected to resistors R9 and R8 respectively, wherein R8 and R9 are both referenced to ground potential.

The DCOFF buffer 52 is a unity gain voltage follower circuit operable to buffer the analog input signal to VDCO and provide this buffered signal to the non-inverting input of amplifier and fault detection circuit 50 via C3 and R4. The analog input signal to VDCO is preferably an analog DC offset compensation signal provided by DC offset compensation circuit 34 as described in co-pending U.S. patent application Ser. No. 09/290,929 filed by Seyed R. Zarabadi et al., which is assigned to the assignee of the present invention and the contents of which have been previously incorporated herein by reference. Alternatively, the analog input signal to VDCO may be any desired analog input signal, whereby amplifier and fault detection circuit 50 is responsive to the buffered analog signal provided thereto via R4 in either case to adjust the DC offset value of the buffer output signal at outputs VOUT1 and VOUT2 in accordance therewith. In either case, the analog supplied to input VDCO of buffer 52 is of a sufficient magnitude and polarity to force the DC component of the output signal at outputs VOUT1 and VOUT2 of amplifier circuit 24 (FIG. 1) to a desired DC signal level, thereby minimizing an aggregate DC offset voltage attributable to sense amplifier circuit 24 including amplifier and fault detection circuit 50 and output buffer 54.

Referring now to current generator circuit 56, the gate and drain of a p-MOS transistor MP4 is connected to the gates of p-MOS transistors MP6 and MP8, and to one end of a resistor R7. The sources of MP4, MP6 and MP8 are connected to VDD. The opposite end of R7 is connected to a diode tree including a series connected stack of three diode-connected NPN transistors QNN5, QNN4 and QNN3 referenced to ground potential. Transistors MP4, MP6 and MP8 form a current mirror, whereby the current provided by the drain of MP6 and the current provided by the drain of MP8 correspond to the current I1 of FIG. 2. The linear temperature dependency of I1 is defined by diodes QNN5, QNN4 and QNN3 as is known in the art.

The gate of MP5 is connected to the drain thereof and to one end of a resistor R6. The opposite end of R6 is connected to a diode-connected NPN transistor QNN6 referenced at ground potential. Transistors MP5, MP7, MP9 and MP10 form a current mirror, whereby the current provided by the drains of MP7, MP9 and MP10 corresponds to the current defined by MP5, R6 and QNN6. The temperature coefficient of the current flowing through MP5, R65 and QNN6 is dominated by R6 and MP5 so that the resulting current flowing through MP7, MP9 and MP10 has a predefined temperature dependency. The temperature dependency of the current flowing through MP7, MP9 and MP10 (as well as through MP12 of FIG. 4) is define in this manner in one preferred embodiment of the present invention to maintain a consistent speed of amplifier and fault detection circuit 50 over a wide temperature range of FIG. 2. Those skilled in the art will recognize that the current flowing through MP7, MP9, MP10 and MP12 may alternatively be designed to have some other temperature dependency so as to meet a different design goal, and that such designs are intended to fall within the scope of the present invention.

Referring now to the amplifier and fault detection circuit 50, VIN1 is connected to a diode-connected PNP transistor QP3 which is series connected to a diode-connected NPN transistor QNN9, wherein QP3 corresponds to diode D1 and QNN9 corresponds to diode D2, both of FIG. 2. The anode of diode D2 defined by the base-collector connection of QNN9 is connected to the drain of MP6, to one end of resistor R5 and to the gate of a n-MOS transistor MN19. The source of MN19 is connected to the sources of n-MOS transistors MN18 and MN28 and to the drain of a n-MOS transistor MN17 having a source connected to ground potential. The drain of MN19 is connected to the drain of MN28, to one end of a capacitor C4, to the gate of a p-MOS transistor MP20 and to the drain of a p-MOS transistor MP24. The source of MP24 is connected to the sources of MP20 and another p-MOS transistor MP23 and to VDD. The opposite end of C4 is connected to the drain of MP20, to the drain of a n-MOS transistor MN15 and to the gate of a n-MOS transistor MN12. The gate of MN15 is connected to the gate and drain of another n-MOS transistor MN16, to the drain of MP7 and to the gate of MN17. The sources of MN15 and MN16 are connected to ground potential.

The gates of MP23 and MP24 are connected together and to the drain of MP23 which is further connected to the drain of MN18. The gate of MN18 is connected to the source of a n-MOS transistor MNB1 having a gate and drain connected to VDD, and to the gate and drain of another n-MOS transistor MNB2 having a source connected to pair of ground referenced series connected diodes QNN8 and QNN7. VIN2 is connected to a diode-connected PNP transistor QP2 which is series connected to a diode-connected NPN transistor QNN10, wherein QP2 corresponds to diode D3 and QNN10 corresponds to diode D4, both of FIG. 2. The anode of diode D4 defined by the base-collector connection of QNN10 is connected to the drain of MP8, to one end of resistor R3 and to the gate of MN28.

The opposite ends of R5, C3 and R4 are connected to the gate of a p-MOS transistor MP18 having a source connected to the source of another p-MOS transistor MP19 and to the drain of MP9. The opposite end of R3 is connected to the gate of MP19, to one end of a capacitor C1 and to one end of resistor R2. The opposite ends of C1 and R2 are connected to the output VSENSE of amplifier and fault detection circuit 50. The drain of MP19 is connected to the gates of n-MOS transistors MN14 and MN13 and to the drain of MN13. The drain of MP18 is connected to one end of a resistor R1, to the gate of a n-MOS transistor MN11, to the drain of MN12 and to the drain of MN13. The sources of MN11–14 are connected to ground potential. The opposite end of R1 is connected to one end of a capacitor C2 having an opposite end connected to the drain of MN11 and to amplifier output VSENSE. Signal paths 60–70 lead to the output buffer circuit 54 of FIG. 4 which will be described in detail hereinafter.

Diode circuits D1–D2 (QP3 and QNN9) and D3–D4 (QP2 and QNN10) provide a level shifter function for the inputs of amplifier and fault detection circuit 50, wherein the gate of transistor MP19 defines the inverting input of amplifier 50 and the gate of transistor MP18 defines the non-inverting input of amplifier 50. This level shifter function allows the common-mode voltage of the input signals at VIN1 and VIN2 to vary between approximately—1.0 and 1.5 volts with no resulting degradation in the amplifier's forward/reverse recovery time, bandwidth, gain, distortion and DC offset voltage. Those skilled in the art will recognize, however, that the required common-mode voltage of the input signals at VIN1 and VIN2 may be defined by the particular application of sense amplifier circuit 24, and that the common-mode voltage allowed by the amplifier and fault detection circuit 50 may accordingly be adjusted by adding/subtracting diodes to/from the diode circuits D1–D2 and D3–D4. In any case, because the current source I1 (supplied via MP6 and MP8) push the current I1 into the level shifter defined by diodes D1–D4, the response time to the common-mode input signal at VIN1 and VIN2 is very fast. The differential input stage of amplifier circuit 50 feeds a wide-band, internally frequency compensated output stage formed by devices MP10, MN11, R1 and C1-3, wherein the output stage defines an output VSENSE of amplifier circuit 50 having rail-to-rail output voltage swing capability. The overall gain of amplifier and fault detection circuit is defined by resistor ratios R4/R5 and R2/R3.

Amplifier and fault detection circuit 50 also includes a fault detection circuit operable to determine whether either or both of the inputs VIN1 and VIN2 are unconnected (i.e., floating). The common connection of MNB1 and MNB2 establishes a reference voltage that is supplied to the gate of MN18 which forms a differential comparator circuit with MN19 and MN28. If either, or both, of VIN1 and VIN2 is an open connection, MN19 and/or MN28 turn off and MN18 turns on, thereby activating the current mirror formed by MP23/MP24 which provides gate drive to MN12. As long as MN12 is turned on, MN11 is turned off and VSENSE is maintained at the rail voltage VDD. Those skilled in the art will recognize that circuit 50 may be alternatively reconfigured to maintain VSENSE near ground potential in the event that either, or both, of VIN1 and VIN2 are open circuited, and that such reconfiguration would be a mechanical step for a skilled artisan.

Figure 4:
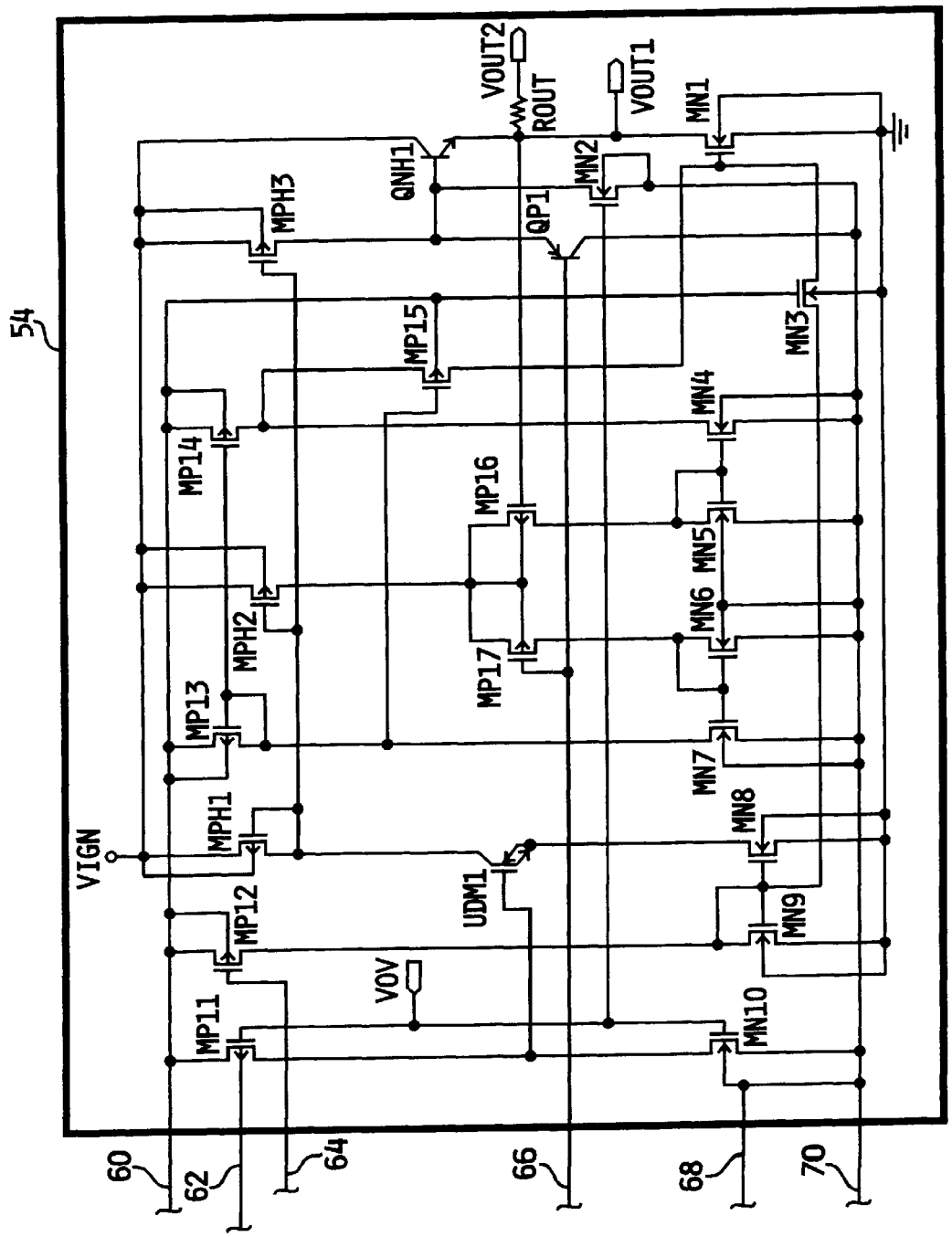
FIG. 4 is a schematic diagram of one preferred embodiment of the output buffer circuit illustrated in FIG. 2, in accordance with the present invention.

Referring now to FIG. 4, one preferred embodiment of a device level structure of the output buffer 54 of FIG. 2, in accordance with the present invention, is shown. Signal lines 60–70 are connected to like-numbered signal paths of FIG. 3, wherein signal line 66 corresponds to the output VSENSE of amplifier and fault detection circuit 50 and is connected to the gate of a p-MOS transistor MP17 and to the base of a PNP transistor QP1. The source of MP17 is connected to the source of another p-MOS transistor MP16 and to the drain of yet another p-MOS transistor MPH2. The gate of MPH2 is connected to the gate and drain of a p-MOS transistor MPH1 having a source referenced to VIGN (where VIGN>VDD; e.g., VIGN=12 volts and VDD=5 volts), to the gate of a p-MOS transistors MPH3 also having a source connected to VIGN and to the drain of a DMOS transistor UDM1.

The gate of MP16 is connected to one end of a resistor ROUT, wherein the opposite end of ROUT defines the output VOUT2. The drain of MP17 is connected to the drain and gate of a n-MOS transistor MN6 and to the gate of another n-MOS transistor MN7, wherein the sources of MN6 and MN7 are connected to ground potential. The drain of MN7 is connected to the drain and gate of a p-MOS transistor MP13, to the gate of another p-MOS transistor MP14 and to the gate of yet another p-MOS transistor MP15. The sources of MP13 and MP14 are connected to VDD, and the source of MP15 is connected to the drain of MP14 and to the drain of a n-MOS transistor MN4. The gate of MN4 is connected to the gate and drain of MN5 and to the drain of MP16, and the sources of MN4 and MN5 are connected to ground potential. The drain of MP15 is connected to the gate of a n-MOS transistor MN1 and to the drain of another n-MOS transistor MN3 having its gate connected to VDD. The source of MN3 is connected to the gate and drain of a n-MOS transistor MN9 and to the gate of another n-MOS transistor MN8, wherein the sources of MN8 and MN9 are connected to ground potential. The drain of MN8 is connected to the source of a DMOS transistor UDM1 having a drain connected to the gate and drain of MPH1. The drain of MP9 is connected to the drain of a p-MOS transistor MP12 having a source connected to VDD and a gate connected to signal path 64.

The gate of UDM1 is connected to the drain of a p-MOS transistor MP11 having a source connected to VDD, and to the drain of a n-MOS transistor MN10 having a source connected to ground potential. The gates of MN10 and MP11 are connected to the overvoltage input VOV and to the gate of a n-MOS transistor MN2. The drain of MN2 is connected to the emitter of QP1, to the base of a NPN transistor QNH1 and to the drain of MPH3. The collector of QNH1 is connected to VIGN. The drain of MN1 is connected to buffer output VOUT1 and the collector of QP1, the source of MN1 and the source of MN2 are connected to ground potential.

In operation, the output buffer circuit 54 provides for a power-efficient output stage of sense amplifier circuit 24. The output VSENSE of the amplifier and fault detection circuit 50 and the output VOUT1 of buffer circuit 54 are provided to a differential comparator stage formed by MP16 and MP17. Under steady state operating conditions, the MN1 is operable to sink a small quiescent current therethrough and VSENSE is operable to drive QP1 and QNH1 cascaded emitter follower transistors to thereby set the buffer circuit output voltage at VOUT1 and VOUT2. Under large capacitive load and large signal conditions, the current flowing through MN1 becomes a function of the difference between the VSENSE and VOUT1 signals. VOUT1 is provided to the gate of MP16 and VSENSE is provided to the gate of MP17 so that if VSENSE is less than VOUT1, current flows through MP17 and turns on the current mirror formed by MN6 and MN7. The current flowing through MN7 causes MP15 to conduct more current to the gate of MN1 which causes MN1 to conduct more of the VOUT1 current therethrough and correspondingly reduce the load current available to VOUT1 and VOUT2. If, on the other hand, VOUT1 is less than VSENSE, current flows through MP16 and turns on the current mirror formed by MN4 and MN5. The current flowing through MN4 reduces the current flowing through MP15, thereby making less gate drive available to MN1 so that MN1 conducts less of the VOUT1 current therethrough, thereby making more of the load current available at the VOUT1 and VOUT2. The load/signal dependent nature of the output stage of buffer circuit 54 accordingly offers a significant savings in power consumption and circuit cost.

If an overvoltage condition exists the signal at input VOV preferably increases sufficiently to turn on MN2 which maintains QNH1 off, and consequently VOUT1 and VOUT2 near ground potential, for the duration of the overvoltage condition.

While the invention has been illustrated and described in detail in the foregoing drawings and description, the same is to be considered as illustrative and not restrictive in character, it being understood that only the preferred embodiments have been shown and described and that all changes and modifications that come within the spirit of the invention are desired to be protected.

What is claimed is:

1. A signal amplifying circuit comprising:
   an amplifier having first and second inputs and an amplifier output defining an output of said signal amplifying circuit;
   a first diode circuit having a cathode defining a first input of said signal amplifying circuit and an anode;
   a first resistor connected between said anode of said first diode circuit and said first input of said amplifier;
   a first current source supplying a first current to a common connection of said anode of said first diode circuit and said first resistor;
   a second diode circuit having a cathode defining a second input of said signal amplifying circuit and an anode; and
   a second resistor connected between said anode of said second diode circuit and said second input of said amplifier;
   wherein said first current source further supplies said first current to a common connection of said anode of said second diode circuit and said second resistor.

2. The signal amplifying circuit of claim 1 further including:
   a DC offset buffer circuit having an input adapted to receive a target signal indicative of a desired amplifier DC offset value and an output producing a buffered representation of said target signal; and
   a third resistor connected between said output of said DC offset buffer and said second input of said amplifier, said buffered representation of said target signal compensating for an aggregate DC offset voltage attributable to said signal amplifying circuit.

3. The signal amplifying circuit of claim 2 further including a fourth resistor connected between said first input of said amplifier and an intermediate output of said amplifier, said first, second third and fourth resistors defining a gain of said amplifier.

4. The signal amplifying circuit of claim 1 further including means for forcing said output of said signal amplifying circuit to a predetermined signal level if either of said first and second inputs of said signal amplifying circuit are floating.

5. The signal amplifying circuit of claim 4 wherein said means for forcing said output of said signal amplifying circuit to a predetermined reference voltage includes:
   a reference circuit producing a reference signal;
   a comparator having a first input receiving said reference signal, a second input connected to said anode of said first diode circuit, a third input connected to said anode of said second diode circuit and a comparator output, said comparator forcing said amplifier output to said predefined signal level if said reference signal exceeds signal levels at either of said anodes of said first and second diode circuits.

6. The signal amplifying circuit of claim 1 wherein said first current has a predefined temperature dependency.

7. The signal amplifying circuit of claim 6 wherein said first diode circuit includes:
   a first diode having a cathode defining said first input of said signal amplifying circuit and an anode; and
   a second diode having a cathode connected to said anode of said first diode and an anode connected to said first resistor and to said first current source, said predetermined temperature dependency of said first current cancelling a temperature dependency of said first and second diodes.

8. The signal amplifying circuit of claim 6 wherein said second diode circuit includes:
   a third diode having a cathode defining said second input of said signal amplifying circuit and an anode; and
   a fourth diode having a cathode connected to said anode of said third diode and an anode connected to said second resistor and to said first current source, said predetermined temperature dependency of said first current cancelling a temperature dependency of said third and fourth diodes.

9. A signal amplifying circuit comprising:

an amplifier defining a first input, a second input and an output, said amplifier adapted for connection to a first voltage supply producing a first voltage reference and a lower reference potential, said amplifier adapted to receive a differential input signal at said first and second inputs and produce as an amplifier output signal an amplified representation of said differential input signal at said amplifier output between a range of said first voltage reference and said lower reference potential; and an output buffer having an input stage connected to said output of said amplifier and an output stage, said output stage adapted for connection to a second voltage supply producing a second voltage reference greater than said first voltage reference and said lower reference potential, said output buffer receiving said amplifier output signal at said output buffer input and producing as a buffered output signal said amplified representation of said differential input signal at said output buffer stage between a range of said second voltage reference and said lower reference potential.

10. The signal amplifying circuit of claim 9 further including:

a DC offset buffer circuit having an input adapted to receive a target signal indicative of a desired amplifier DC offset value and an output producing a buffered representation of said target signal;

and wherein said amplifier is responsive to said buffered representation of said target signal to cancel an aggregate DC offset voltage attributable to said signal amplifying circuit.

11. The signal amplifying circuit of claim 9 further including means for forcing said output of said amplifier to a predetermined signal level if either of said first and second inputs are floating.

12. The signal amplifying circuit of claim 9 wherein said output buffer is operable to produce a load current associated with said output buffered output signal, said output buffer including means for comparing said amplifier output signal with said buffered output signal and modulating said load current as a function of a difference between said amplifier output signal and said buffered output signal.

13. The signal amplifying circuit of claim 9 wherein said first voltage reference corresponds to a logic level reference and said second voltage reference corresponds to a vehicle battery voltage reference.

14. A signal amplifying circuit comprising:

an amplifier responsive to an input signal to produce as an amplifier output signal an amplified representation of said input signal; and an output buffer having an input stage receiving said amplifier output signal and an output stage responsive to said amplifier output signal to produce a buffered output signal and associated load current at a buffer output, said output buffer including:

a comparator having a first input receiving said amplifier output signal, a second input receiving said buffered output signal, a first comparator output and a second comparator output;

a first current source connected to said first comparator output, said comparator activating said first current source if said amplifier output signal is greater than said buffered output signal a second current source connected to said second comparator output, said comparator activating said second current source if said buffered output signal is greater than said amplifier output signal; and a load current modulating circuit responsive to activation of said first current source to reduce a portion of said load current drawn from said buffer output by said output stage, and responsive to activation of said second current source to increase a portion of said load current drawn from said buffer output by said output stage.

15. The signal amplifying circuit of claim 14 further including an overvoltage protection circuit having an input adapted to receive an overvoltage reference signal, said overvoltage protection circuit forcing said buffer output to a predefined signal level if said overvoltage reference signal exceeds a predefined overvoltage reference signal level.

16. The signal amplifying circuit of claim 15 wherein said overvoltage protection circuit is operable to force said buffer output to a ground potential if said overvoltage reference signal exceeds said predefined overvoltage reference signal level.

* * * * *